United States Patent
Gogoi (10) Patent No.: US 7,405,099 B2
(45) Date of Patent: Jul. 29, 2008

(54) WIDE AND NARROW TRENCH FORMATION IN HIGH ASPECT RATIO MEMS

(75) Inventor: Bishnu P. Gogoi, Scottsdale, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 546 days.

(21) Appl. No.: 11/192,198

(22) Filed: Jul. 27, 2005

(65) Prior Publication Data

US 2007/0026636 A1    Feb. 1, 2007

(51) Int. Cl.
*H01L 21/00* (2006.01)

(52) U.S. Cl. .................... 438/50; 438/51; 438/52; 438/53; 257/414; 257/415; 257/417

(58) Field of Classification Search ............ 438/50–53; 257/414, 415, 417, E29.324
See application file for complete search history.

(56) References Cited

U.S. PATENT DOCUMENTS

| | | | |
|---|---|---|---|
| 5,349,855 | A | 9/1994 | Bernstein et al. |
| 5,660,680 | A | 8/1997 | Keller |
| 6,516,666 | B1 | 2/2003 | Li |
| 6,649,947 | B2 | 11/2003 | Rodgers et al. |
| 2004/0207074 | A1 | 10/2004 | MacDonald et al. |
| 2005/0066728 | A1 | 3/2005 | Chojnacki et al. |
| 2005/0082252 | A1 | 4/2005 | Nasiri et al. |
| 2005/0084998 | A1 | 4/2005 | Horning et al. |
| 2005/0098840 | A1* | 5/2005 | Fuertsch et al. ........... 257/414 |
| 2007/0262048 | A1* | 11/2007 | Rana et al. ................... 216/6 |

OTHER PUBLICATIONS

Selvakumar, Arjun et al., "Vertical Comb Array Microactuators," Journal of Microelectromechanical Systems, vol. 12, No. 4, Aug. 2003, pp. 440-449.
Selvakumar, Arjun et al., "Vertical Comb Array Microactuators," Center for Integrated Sensors and Circuits, 1995 IEEE, pp. 43-48.
Chang, C. et al., "Trench Filling Characteristics of Low Stress TEOS/Ozone Oxide Deposited by PECVD and SACVD," Microsystem Technologies 10, 2004, pp. 97-102.
Zhang, C. et al., "Fabrication of Thick Silicon Dioxide Lawyers Using Drie, Oxidation and Trench Refill," Center for Wireless Integrated Microsystems, EECS Department, 2002 IEEE, pp. 160-163.

* cited by examiner

*Primary Examiner*—Fernando L. Toledo
*Assistant Examiner*—Jae Lee
(74) *Attorney, Agent, or Firm*—Ingrassia, Fisher & Lorenz, P.C.

(57) ABSTRACT

Methods have been provided for forming both wide and narrow trenches on a high-aspect ratio microelectromechanical (MEM) device on a substrate including a substrate layer (126), an active layer (128), and a first sacrificial layer (130) disposed at least partially therebetween. The method includes the steps of forming a first trench (154), a second trench (156), and a third trench (152) in the active layer (128), each trench (154, 156, 152) having an opening and sidewalls defining substantially equal first trench widths, depositing oxide and sacrificial layers thereover and removing the oxide and sacrificial layers to expose the third trench (152) and form a fourth trench (190) in the active layer (128) from the first and the second trench (154, 156), the fourth trench (190) having sidewalls defining a second trench width that is greater than the first trench width.

19 Claims, 5 Drawing Sheets

WIDE AND NARROW TRENCH FORMATION IN HIGH ASPECT RATIO MEMS

TECHNICAL FIELD

The present invention generally relates to microelectromechanical (MEM) devices and, more particularly, to a method for manufacturing MEM devices.

BACKGROUND

Many devices and systems include various numbers and types of sensors. The varied number and types of sensors are used to perform various monitoring and/or control functions. Advancements in micromachining and other microfabrication techniques have enabled manufacture of a wide variety of microelectromechanical (MEM) devices, including various types of sensors. Thus, in recent years, many of the sensors that are used to perform monitoring and/or control functions are implemented using MEM sensors.

One particular type of MEM sensor that is used in various applications is a gyroscope. A MEM gyroscope is used to measure an angular rate of an object and may be constructed from a silicon-on-insulator wafer that includes a substrate layer, a sacrificial layer overlying the substrate layer, and an active layer overlying the sacrificial layer. Trenches are etched into the active layer and, in some cases, undercut the active layer, to form among other component parts, a proof mass and capacitive elements. The proof mass is resiliently suspended by one or more suspension springs and capable of moving along one or more of at least three orthogonal axes when the MEM gyroscope experiences a directional or speed change. The capacitive elements sense displacement of the proof mass, and the displacement is converted into an electrical signal having a parameter magnitude relating to angular rate.

Typically, the trenches that make up the proof mass and capacitive elements have substantially equal widths; however, some MEM devices, such as high aspect ratio MEM gyroscopes, may need trenches that do not have equal widths. For example, in instances in which a strong electrical signal is preferred, the capacitive elements may preferably be separated from one another by a narrow trench. If a MEM gyroscope having heightened sensitivity is preferred, a wide trench may be needed to surround the proof mass because the sensitivity depends on the amplitude of the oscillation of the proof mass.

In a conventional process for forming narrow and wide trenches on the same substrate, photoresist is first deposited over the substrate active layer in a predetermined pattern. The pattern includes component sections that are separated from one another by narrow and wide gaps. After the photoresist is deposited, material not protected by the photoresist is etched away. As a result, narrow and wide trenches are formed in the substrate.

However, because the material is etched away at a rate that is dependent on the width of the trench, more material is removed from the wide trench than from the narrow trench. Additionally, when the wide trench is completely etched down as desired, the narrow trench may not be completely etched. Thus, if both trenches are etched for a comparable amount of time, e.g. until the narrow trench is completely etched, the etchants may etch more of the wide trench than desired which may compromise the quality of the resulting MEM device. Moreover, the shape and profile of the wide trench may be affected by the increased time needed for completion of narrow trench etching. Consequently, the behavior and performance of the MEM device may be compromised.

In addition to incorporating trenches into the MEM device, interconnects may be needed to electrically connect different parts of the device. The interconnects form bridges and require a planar surface for proper formation. However, current etching technology does not provide for techniques for refilling trenches while also enabling the formation of the electrical interconnects.

Hence, it would be desirable to have a method of making a MEM device, that addresses one or more of the above-noted drawbacks. Specifically, it would be desirable to have a method in which both wide and narrow trenches having substantially equal depths may be formed in the same wafer. Moreover, it would be desirable to have a method that is relatively simple and inexpensive to implement. The present invention addresses one or more of these needs. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description. In this regard, although the invention is depicted and described in the context of an accelerometer, it will be appreciated that the invention at least could be used for any one of numerous devices that include narrow and wide trenches formed in a substrate.

Figure 1:
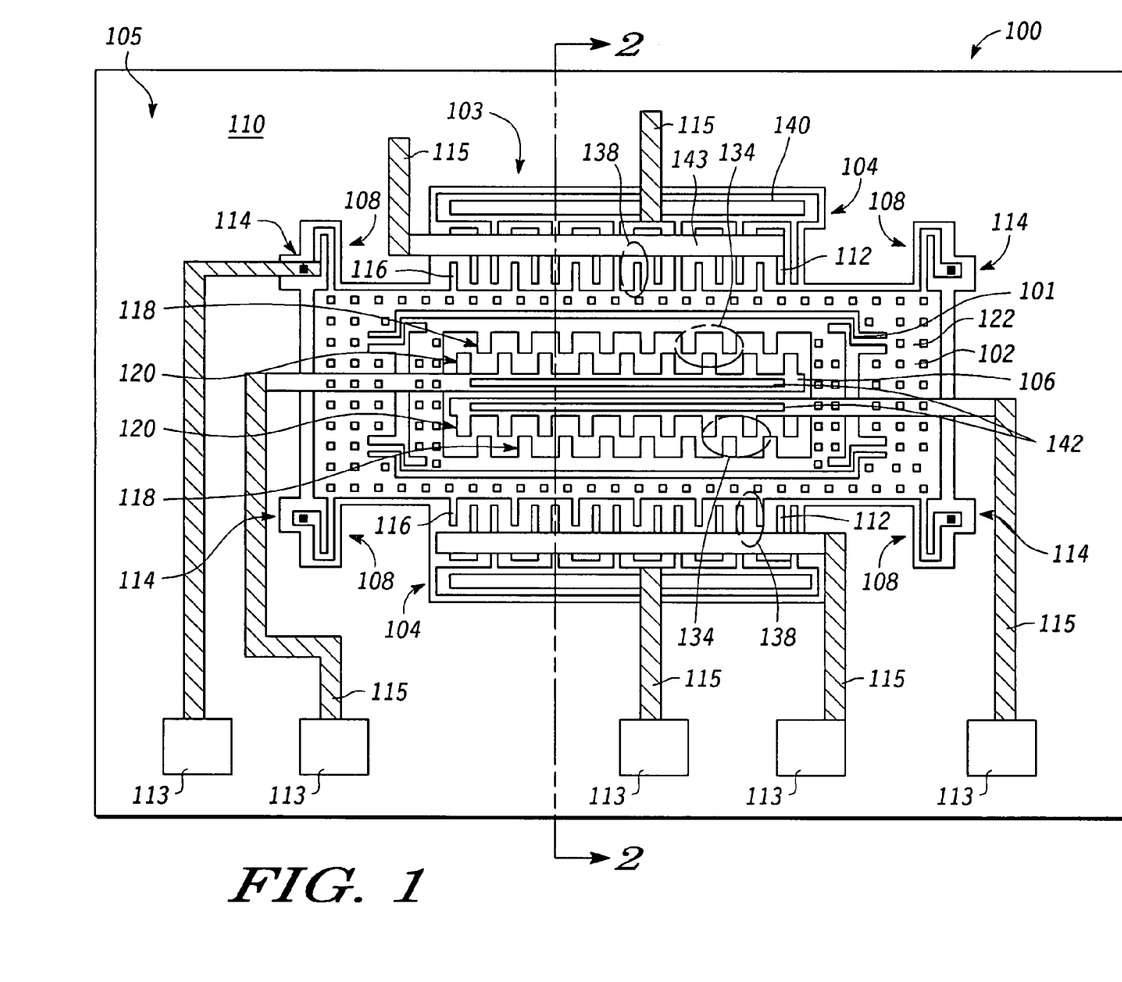
FIG. 1 is a top view of a physical implementation of the MEM device shown in FIG. 1 that may be manufactured according the exemplary inventive process of the present invention.

Turning now to the description, and with reference first to FIG. 1, a top view of an exemplary microelectromechanical (MEM) device 100 is depicted. The MEM device 100, which is shown in simplified form, is an inertial rate sensor, such as a gyroscope, and includes an active region 103 and a field region 105. The active region 103 includes a proof mass 102 disposed between two sets of sense electrodes 104 and two sets of drive electrodes 106. Each of these components is formed in a substrate 110. The field region 105 includes an electrical isolation layer 129 that is preferably disposed around the proof mass 102, sense electrodes 104, drive electrodes 106 and other components formed in the active region 103. In one exemplary embodiment, a plurality of bond pads 113 are also formed on the substrate 110 and interconnects 115 extend over the field region 105 to electrically couple the bond pads 113 to at least one of the proof mass 102, the sense electrodes 104, and the drive electrodes 106.

The proof mass 102 is anchored to the substrate 110 via an anchor 114 but is partially suspended over the substrate 110 by suspension springs 108. The sense electrodes 104 include fixed sense electrode fingers 112 and a first and a second plurality of moving sense electrode fingers 116, and the drive electrodes 106 include a first and a second plurality of moving drive electrode fingers 118 and fixed drive electrode fingers 120. The first and second pluralities of moving sense electrode fingers 116 extend from the proof mass 102 and interleave with the fixed sense electrode fingers 112, which are anchored to the substrate 110 via anchors 140 and 143. The first and second pluralities of moving drive electrode fingers 118 also extend from the proof mass 102 and are configured to interleave with each fixed drive electrode finger 120, which are anchored to the substrate 110 via anchors 142.

Figure 2:
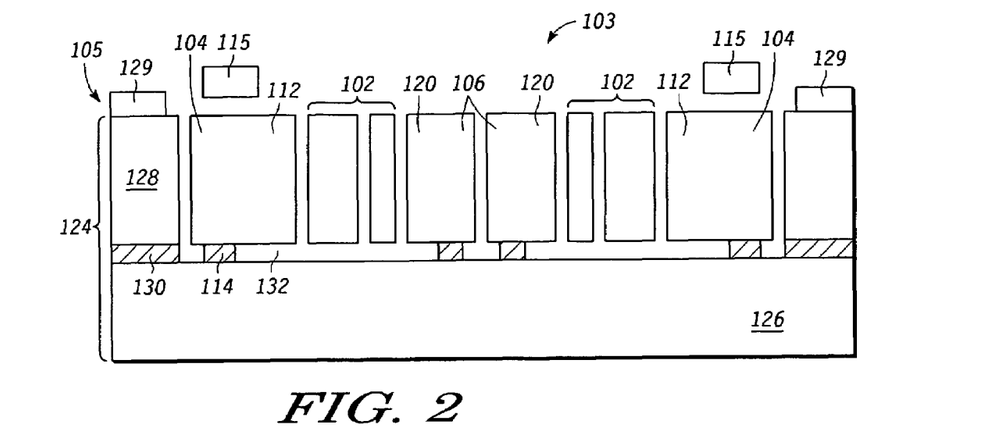
FIG. 2 is a simplified cross-sectional view of the exemplary MEM device depicted in FIG. 1 taken along line 2-2.

FIG. 2 is a cross-sectional view of the MEM device 100 taken along line 2-2. As shown in FIG. 2, the proof mass 102, sense electrodes 104, and drive electrodes 106 are formed on an SOI (semiconductor-on-insulator) wafer 124. The SOI wafer 124, as is generally known, includes a substrate layer 126, an active layer 128, and a first sacrificial layer 130 disposed between the substrate layer 126 and the active layer 128. The proof mass 102, sense electrodes 104, and drive electrodes 106 are all formed in the active layer 128. The proof mass 102, while being coupled to the substrate layer 126, is also partially released therefrom for suspension over the substrate layer 126. Specifically, during a release process, the proof mass 102 and its moving drive electrode fingers 118 (FIG. 1) and moving sense electrode fingers 116 are partially undercut by removing portions of the first sacrificial layer 130 below portions of the proof mass 102 through etch holes 122 formed in the proof mass 102. This undercut forms a release trench 132, and releases portions of the proof mass 102 from the substrate layer 126. The drive electrodes 106 and sense electrodes 104 remain affixed to the substrate layer 126, via anchors 140, 142, 143 formed in the sacrificial layer 130.

The MEM device 100, constructed as shown in FIGS. 1 and 2, is implemented as a capacitance type gyroscope. That is, when the device 100 experiences a change in angular rate and is in oscillation by, for example, applying a voltage between the fixed and moving drive electrodes 106, the proof mass 102 will move, due to the flexibility of the suspension springs 101. The resulting Coriolis acceleration due to the interaction of the force applied along the drive axis and the input angular velocity is transmitted by the suspension springs 101 to the outer part of the proof mass 102. The design of the suspension springs are such that only the Coriolis acceleration is transmitted to the outer part of the proof mass and measured by the moving sense electrode fingers 116. The moving drive electrode fingers 118 are connected to the proof mass 102, and will thus move the same distance as the proof mass 102. In this regard, wide drive gaps 134 are preferably formed between the moving drive electrode fingers 118 and fixed drive electrode fingers 120 to provide a sufficiently large space within which the proof mass 102 can move, as shown in FIG. 1.

The fixed sense electrode fingers 112 and adjacent moving sense electrode fingers 116 together form a variable differential capacitor. For example, when the MEM sensor 100 experiences an angular rate change, each moving sense electrode finger 116 will move toward one of the adjacent fixed sense electrode fingers 112 and away from another of the adjacent fixed sense electrode fingers 112. The distance that the moving sense electrode finger 116 moves will result in a proportional change in capacitance between the fixed sense electrode fingers 112 and the moving sense electrode finger 116. To amplify signals that indicate the capacitance change, narrow sense gaps 138 are preferably formed between fixed sense electrode fingers 112 and moving sense electrode fingers 116.

Having described an embodiment of a MEM device 100 from a structural standpoint, a particular preferred process of forming the described MEM device 100 will now be described. In doing so reference should be made, as appropriate, to FIGS. 3-12. It will be appreciated that, for clarity and ease of explanation, the process will be depicted and described using a simplified cross section view of a wafer 124. The positioning of the components formed in the wafer 124 is representative only and may not necessarily correspond with the positioning of the same components depicted in FIGS. 1 or 2. It will be further appreciated that the process is applicable to any one of numerous other MEM sensors that may be implemented. It will additionally be appreciated that although the method is, for convenience, described using a particular order of steps, the method could also be performed in a different order or using different types of steps than what is described below.

Figure 3:
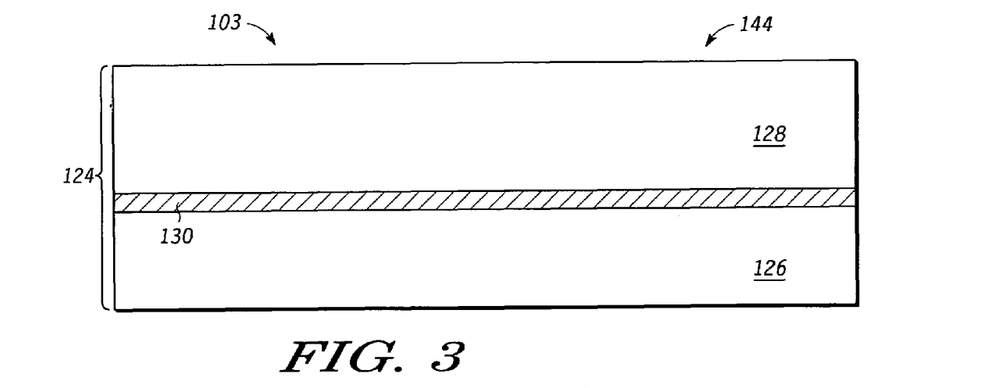
FIGS. 3-12 are simplified cross section views of the MEM device shown in FIG. 1, illustrating the various exemplary methodological steps that are used to make various MEM devices in accordance with an embodiment of the present invention.

With the above background in mind, and with reference first to FIG. 3 which illustrates a portion of the active region 103, it is seen that the preferred starting material 144 for the process is an SOI wafer 124. Alternatively, the starting material 144 may be any one of numerous other articles including articles with a substrate layer 126, an active layer 128, and an interposed first sacrificial layer 130. No matter the specific type of starting material, the substrate layer 126 and active layer 128 are each preferably made of silicon, though it will be appreciated that these layers could be made of other materials. It will be appreciated that the active layer 128 may be, for example, epitaxial silicon, or any other material from which the MEM sensor elements may be formed. The first sacrificial layer 130 is preferably made of a material, such as silicon oxide, doped oxide, and doped silicate glass, just to name a few, that can be readily etched to release at least some of the sensor elements from the substrate layer 126. It will be appreciated that the starting material 144 may include the substrate layer 126, the active layer 128, and first sacrificial layer 130 when obtained, or one or more of these layers may be formed as part of the overall process. Although the field region 105 is not depicted herein, it will be appreciated that an electrical isolation material, such as, for example, silicon nitride, is preferably deposited, pattern and etched over the associated active layer 128 to form the electrical isolation layer 129 (shown in FIG. 2).

Figure 4:
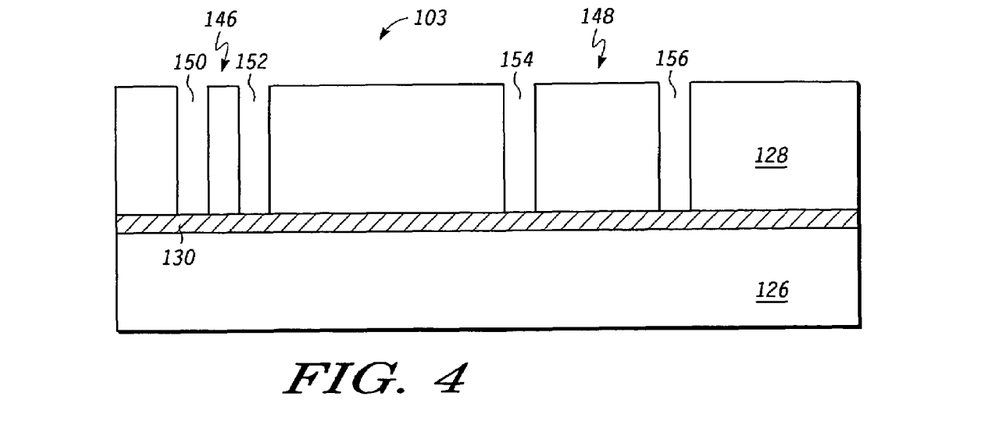

Turning to FIG. 4, having obtained (or prepared) the starting material 144, the active layer 128 is then patterned and etched to define a narrow trench region 146 and a wide trench region 148 therein. In later steps, the narrow trench region 146 forms the fixed and moving sense electrode fingers 112 and 116 and the wide trench region 148 forms the moving and fixed drive electrode fingers 118 and 120. It will be appreciated that any one of numerous patterning and etching processes may be used; however, in a preferred embodiment, a dry reactive ion etch (DRIE) process is used. No matter the specific process that is used, it results in a plurality of trenches 150, 152, 154, and 156 being formed in the active layer 128, which define the structural features of the individual sensor elements. The trenches 150, 152, 154, and 156 each preferably have substantially equal widths and each provides access to the first sacrificial layer 130. Although only four trenches 150, 152, 154, and 156 are illustrated in FIG. 4, it will be appreciated that the number of trenches 150, 152, 154, and 156 employed is at least partially selected to implement the desired sequence and/or timing of the release of the sensor elements.

Figure 5:
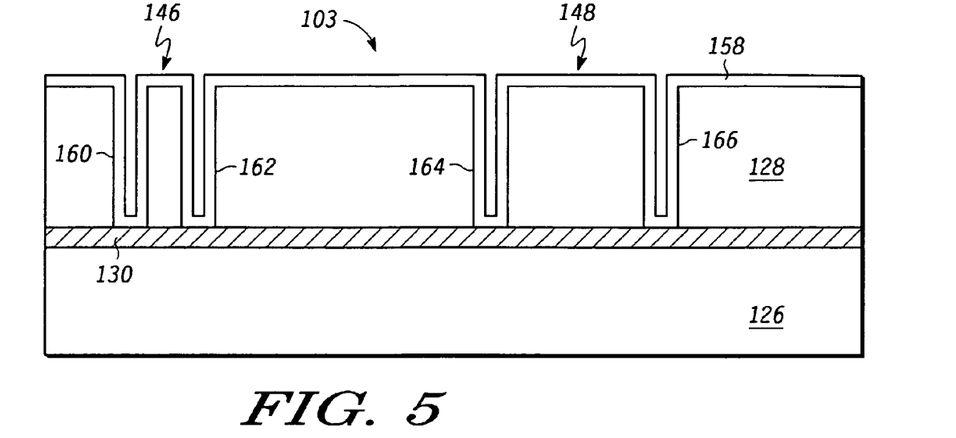

Once the trenches 150, 152, 154, and 156 are formed, as is shown more clearly in FIG. 5, a sacrificial material is deposited over the active layer 128 and on the sidewalls 160, 162, 164, and 166 of the trenches 150, 152, 154, and 156 to form a second sacrificial layer 158 such that the trenches 150, 152, 154, and 156 are not sealed. In one exemplary embodiment, the second sacrificial layer 158 comprises silicon oxide or tetraethyl orthosilicate ("TEOS") that conformally covers all the surfaces of the trenches 150, 152, 154, and 156. However, it will be appreciated that the second sacrificial layer 158 may be implemented using any one of numerous suitable materials now known or developed in the future including, for example, a nitride material.

Figure 6:
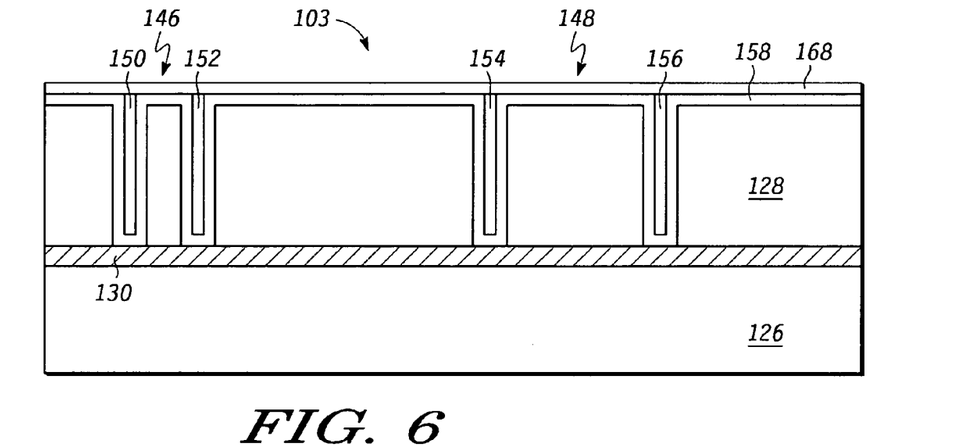

Thereafter, and with reference to FIG. 6, a third sacrificial layer 168 is deposited (or formed) over each of the trenches 150, 152, 154, and 156 and portions of the second sacrificial layer 158. The third sacrificial layer 168 may comprise any one of numerous types of readily etchable materials such as, for example, an oxide, such as $SiO_2$ or tetraethylorthosilicate (TEOS), or a glass material, such as, for example, phosphosilicate glass (PSG), borosilicate glass (BSG), borophosphosilicate glass (BPSG), and undoped silicon glass (USG). Moreover, it will be appreciated that in some embodiments the third sacrificial layer 168 may comprise the same material as that of the second sacrificial layer 158. However, in the preferred embodiment, the third sacrificial layer 168 is phosphosilicate glass (PSG). Nonetheless, it will be further appreciated that the exact choice of material for the third sacrificial layer 168 for a given application may depend, for example, on such factors as the composition of the various sensor components and other structural features that will be present on the MEM device 100 at the time that the release of the proof mass 104 is carried out, the specific etchant that is used, and the selectivity of the etchant to the materials of these features or components. Preferably, the third sacrificial layer 168 is deposited such that the trenches 150, 152, 154, and 156 are sealed, but not filled. In this regard, third sacrificial layer 168 material may first be deposited over the second sacrificial layer 158 and then reflowed to seal the trenches 150, 152, 154, and 156. In other embodiments, it may be preferably not to fill the trenches 150, 152, 154, 156.

Although the second and third sacrificial layers 158, 168 are described herein as being deposited separately, it will be appreciated that the layers 158, 168 may alternatively be combined as a single conformal sacrificial layer. In such case, the combined layer is preferably made of materials that are easily etched during subsequent release processes, such as, for example, PSG or doped TEOS. Additionally, the combined layer may be deposited using any one of numerous conventional techniques, such as, for example, by low pressure chemical vapor deposition ("CVD"), or other CVD techniques.

Figure 7:
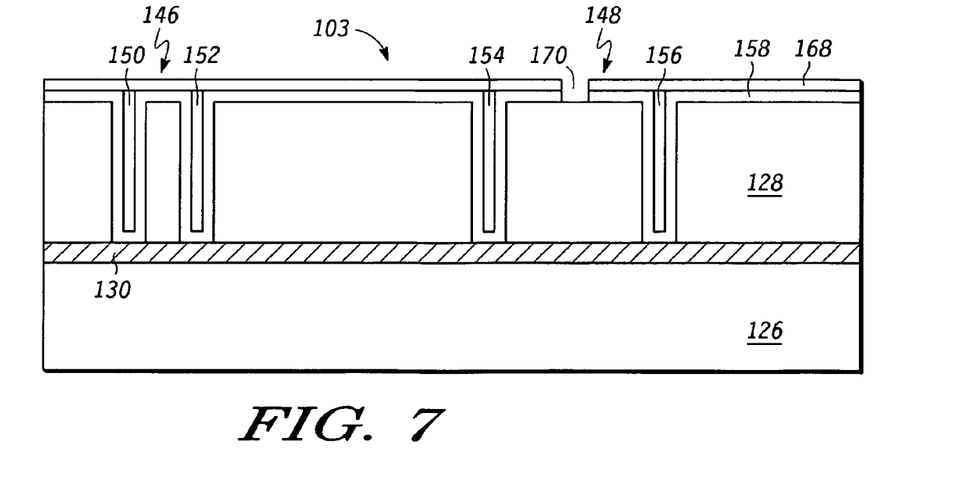

Next, an opening 170 is formed in the wide trench region 148, for example, between trench 154 and 156, to thereby expose a surface of the active layer 128, as shown in FIG. 7. The opening 170 may be formed using any one of numerous conventional techniques. For example, a photoresist may be deposited in a pattern over the third sacrificial layer 168, wherein the pattern includes a protected portion and an unprotected portion. Then, the portions of the third sacrificial layer 168 material and sacrificial layer 158 is etched that is unprotected by the photoresist is etched to form the opening 170.

Figure 8:
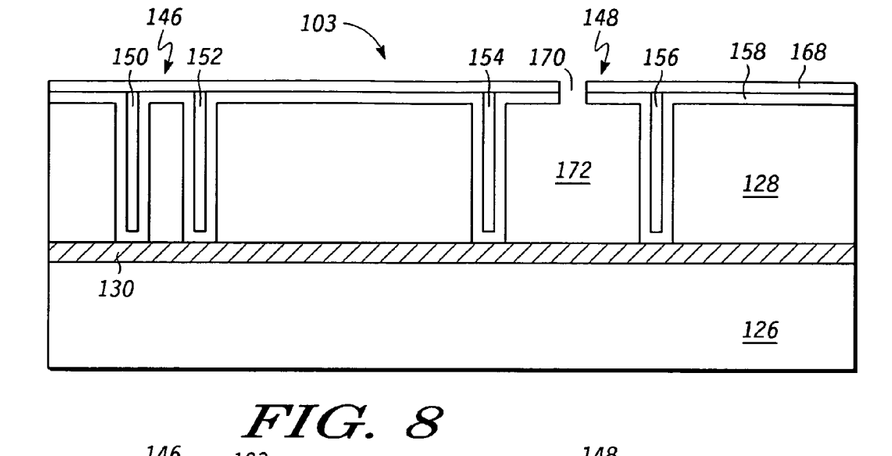

As shown in FIG. 8, after the opening 170 is formed, material from the active layer 128 that is disposed between the trenches 154 and 156 is removed to form a cavity 172. The active layer 128 may be removed using any one of numerous well-known processes. In one exemplary embodiment, the active layer 128 is exposed to an isotropic gas etching process. For example, in an embodiment in which the active layer 128 is silicon, it may be contacted with a gas, such as, for example, xenon difluoride, and the gas travels through the opening 170 to etch the active layer 128 material. In another exemplary embodiment, an isotropic wet etching process is used on the active layer 128. The wet etchant may be a solution of potassium hydroxide, tetramethyl ammonium hydroxide, or other similar chemicals.

Figure 9:
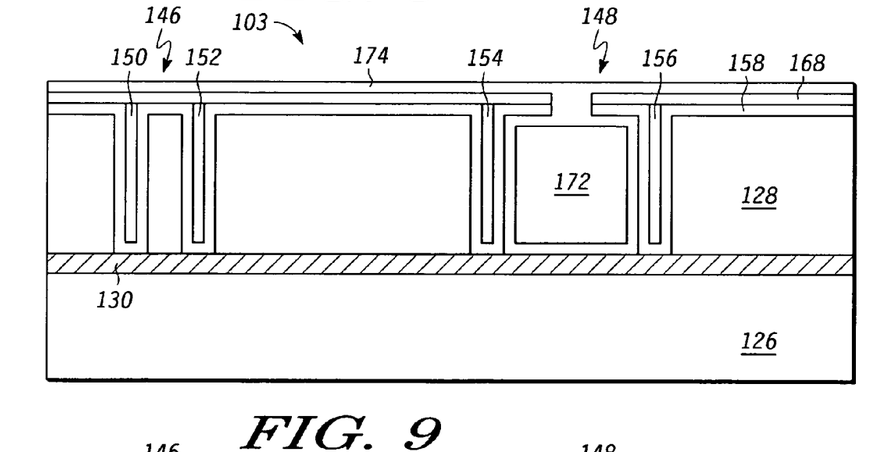

Then, a fourth sacrificial layer 174, which is shown in FIG. 9, is deposited (or formed) onto at least the third sacrificial layer 168 and the walls of the cavity 172. In a particular preferred embodiment, the fourth sacrificial layer 174 comprises the same material as the third sacrificial layer 168 and is PSG. However, as with the third sacrificial layer 168, it will be appreciated that it could be implemented using any one of numerous suitable materials now known or developed in the future.

Figure 10:
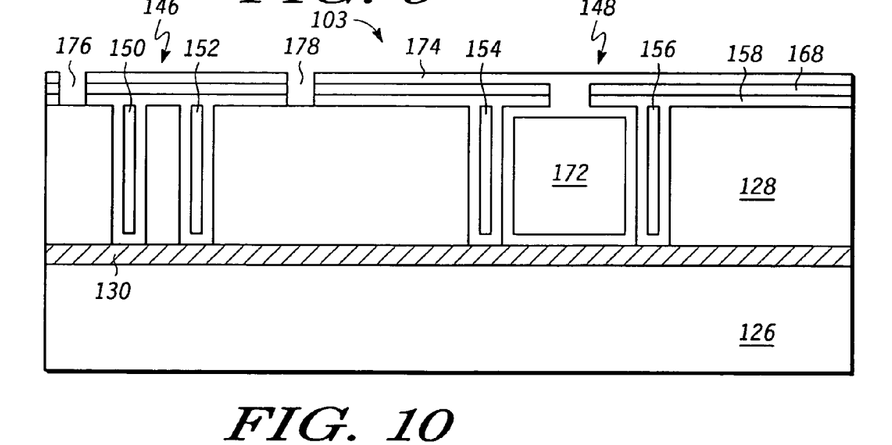
Figure 11:
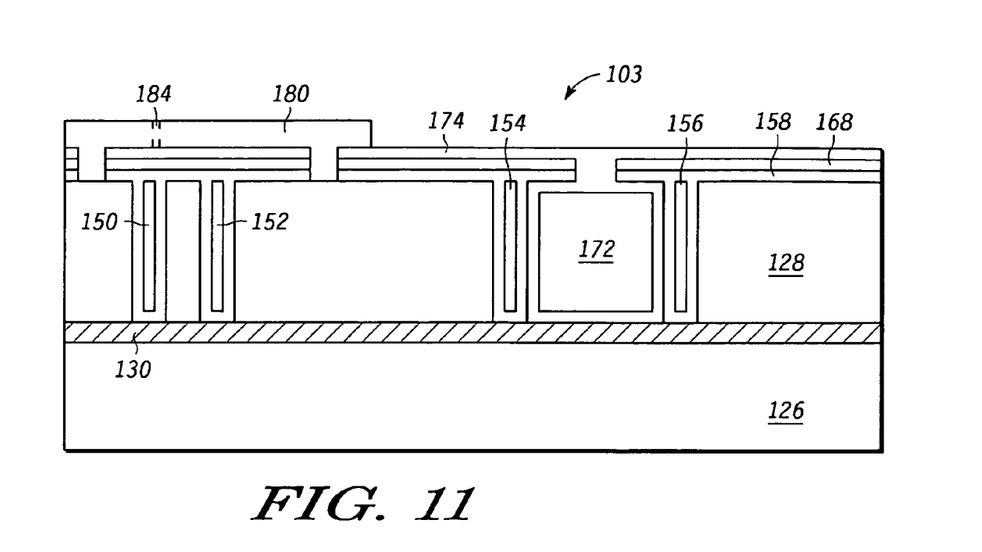

Following deposition of the fourth sacrificial layer 174, an interconnect may be formed on the wafer 124. In one exemplary embodiment, and as shown in FIG. 10, a first contact opening 176 and a second contact opening 178 are formed through the second, third, and fourth sacrificial layers 158, 168 and 174 to expose a portion of the active layer 128. It will be appreciated that although shown as being performed in the active region 103, the formation of the contact openings may additionally be performed in the field region 105. Although the first and second contact opening 176 and 178 are depicted as being formed in the narrow trench region 146, it will be appreciated that they may be formed in any other section of the wafer 124 where an interconnect may be needed. Next, a top layer of, for example, polycrystalline silicon 180, which may be doped as-deposited or doped after being deposited, is deposited over the fourth sacrificial layer 174 and into the first and second contact openings 176, 178. As FIG. 11 shows, the polycrystalline silicon 180 includes a plurality of etch holes 184 that expose a surface of the fourth sacrificial layer 174. The etch holes 184 may be etched into the deposited polycrystalline silicon 180.

In one exemplary embodiment, bond pads are formed on silicon 180. In this regard, another layer of sacrificial material (not illustrated), such as, PSG, is deposited over the polycrystalline silicon 180. Openings are etched into the deposited layer to define the positioning of the bond pads. Next, metal is deposited over a portion of the third layer and into the openings to define the bond pads.

In either case, the first, second, third, and fourth sacrificial layers 130, 158, 168, 174 are selectively etched. A variety of etch processes could be used to etch away the aforementioned layers and materials. For example, a vapor phase etch process could be used. In another exemplary embodiment, a wet etch process using a wet etch solution, such as an aqueous hydrofluoric acid (HF) solution, is used. In either case, the vapor or solution is introduced into the etch holes 184 in the top layer of polycrystalline silicon 182 or the non-illustrated sacrificial material described above. It will be appreciated that additional process steps may be implemented to complete formation of the device. However, the description of these additional steps is not needed to enable or understand the present invention and will, therefore, not be further described.

Figure 12:
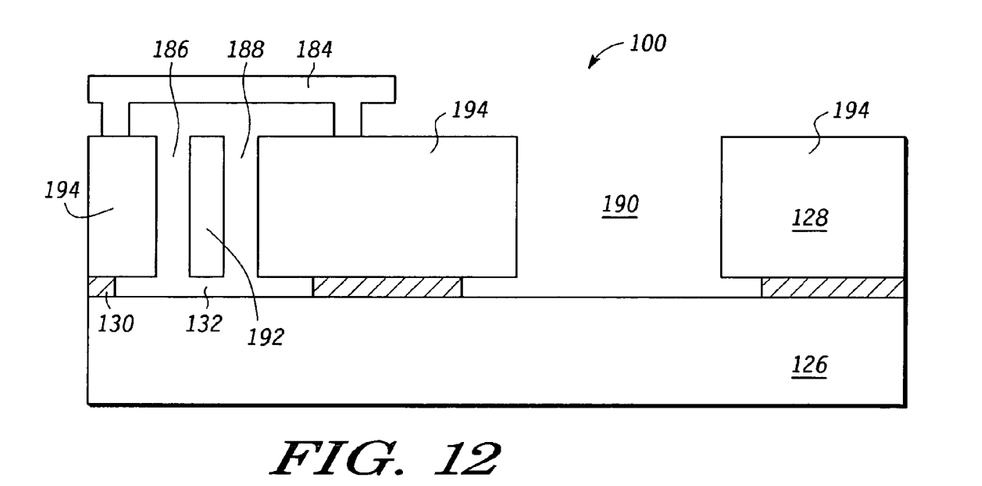

After the selected portions of the first, second, third, and fourth sacrificial layers 130, 158, 168, 174 are removed, the resulting device 100 is formed, as shown in FIG. 12. The removal of material forms narrow trenches 186 and 188 between suspension elements 192 that make up the narrow sense gaps 138 and a wide trench 190 between fixed elements 194 that makes up the wide drive gap 134 (shown in FIG. 1). It will be appreciated that the narrow trenches 186 and 188 are formed from trenches 150 and 152, respectively, while the wide trench 190 is formed from trenches 154 and 156. The wide trench 190 has a trench width that is greater than the trench widths of narrow trenches 186, 188. The device also includes an interconnect 184 disposed over the active layer 126.

As was previously noted, although the above-described MEM device 100 is a gyroscope, the manufacturing process described herein is not limited to gyroscopes or any other type of sensor, but is also applicable to any one of numerous MEM devices that include some type of structure that is movably suspended by one or more springs and that includes wide and narrow trenches formed therein. Non-limiting examples of such devices include various types of accelerometers and switches, optical MEM system components, and other MEM system devices that use drive and sense electrodes.

Methods have been provided for forming both wide and narrow trenches on a high-aspect ratio microelectromechanical (MEM) device on a substrate including a substrate layer, an active layer, and a first sacrificial layer disposed at least partially therebetween. In one embodiment, and by way of example only, the method includes the steps of forming a first trench, a second trench, and a third trench in the active layer, each trench having an opening and sidewalls defining substantially equal first trench widths, forming a second sacrificial layer over a surface of the active layer and the sidewalls of each of the trenches, forming a third sacrificial layer over the second sacrificial layer and sealing the openings of each of the trenches with the third sacrificial layer, forming an etch hole in the third sacrificial layer and the second layer between the first trench and the second trench to expose a portion of the active layer, removing material from the active layer between the first trench and the second trench to form a cavity having sidewalls and an opening, forming a fourth sacrificial layer over the third sacrificial layer and the sidewalls of the cavity and sealing the cavity and its opening with the fourth sacrificial layer, and removing the second, third, and fourth sacrificial layers to expose the third trench and form a fourth trench in the active layer from the first and the second trench, the fourth trench having sidewalls defining a second trench width that is greater than the first trench width.

Alternatively, the step of forming the first trench, the second trench, and the third trench comprises etching the active layer using a deep reactive ion etch process. In still another embodiment, the steps of forming the second sacrificial layer and forming the third sacrificial layer are combined and the second sacrificial layer and the third sacrificial layer are a single layer. In another embodiment, the third sacrificial layer comprises at least one material selected from the group consisting of glass and oxide. In still another embodiment, the third and fourth trenches have substantially equal trench depths. In still yet another embodiment, the third sacrificial layer and fourth sacrificial layer comprise the same material. In still yet another embodiment, the first sacrificial layer comprises the same material as the third sacrificial layer. In yet another embodiment, the step of forming the third sacrificial layer comprises depositing a sacrificial material over a portion of the second sacrificial layer overlying the surface of the active layer, and reflowing the sacrificial material to coat a portion of the second sacrificial layer overlying the sidewalls of the trenches and to seal the openings of the trenches.

In still yet another embodiment, the step of forming the hole comprises depositing photoresist over the third sacrificial layer in a pattern, wherein the pattern includes a protected portion and an unprotected portion, and etching the second and third sacrificial layers of the unprotected portion to form the hole exposing the active layer. In still yet another embodiment, the step of removing material from the active layer between the first trench and the second trench comprises performing a gas phase etch on the active layer material between the first trench and the second trench. In still yet another embodiment, the step of removing material from the active layer between the first trench and the second trench comprises performing a wet etch on the active layer material between the first trench and the second trench.

Alternatively, the method may further comprise the step of forming a first contact opening and a second contact opening through the second sacrificial layer, the third sacrificial layer, and the fourth sacrificial layer, after the step of forming the fourth sacrificial layer, and depositing an interconnect material over the third sacrificial layer and filling the first contact opening and second contact opening with the interconnect material to form an interconnect. In another embodiment, the method may further comprise forming a fifth trench adjacent the third trench, the fifth trench having an opening and sidewalls defining a width substantially equal to the first trench width, removing a portion of the first sacrificial layer proximate the third trench and the fifth trench to form a suspension element from material of the active layer between the third trench and the fifth trench.

In another exemplary embodiment, a method is provided for forming a wide trench and a narrow trench on a substrate including an active layer disposed over a first sacrificial layer, the active layer having a surface. The method includes the steps of etching a first trench and a second trench through the active layer to expose a surface of the first sacrificial layer, each trench having an opening, sidewalls defining a first trench width, and substantially equal and uniform first trench widths, oxidizing the surface of the active layer and the sidewalls of the first trench and second trench, depositing a sacrificial material over the oxidized surfaces to form a second sacrificial layer, sealing the openings of the trenches with at least a portion of the second sacrificial layer, etching a hole through a portion of the second sacrificial layer and the oxidized surface to expose a portion of the active layer, removing material from the active layer between the first trench and the second trench to form a cavity having sidewalls, depositing another sacrificial material over the second sacrificial layer and the sidewalls of the cavity to form a third sacrificial layer, sealing the cavity with at least a portion of the third sacrificial layer, and removing the second sacrificial layer, the third sacrificial layer, and material from the oxidized surface of the active layer to form a third trench in the active layer from the first and the second trenches, the third trench having a sidewalls defining a second trench width that is greater than the first trench width.

In another embodiment of the method, the method further comprises the steps of forming a first contact opening and a second contact opening through the first sacrificial material and the second sacrificial material, after the step of forming the depositing the second sacrificial material, and depositing an interconnect material over the second sacrificial material and filling the first contact opening and second contact opening with the interconnect material to form an interconnect. Alternatively, the method may further comprise etching a fourth trench through the active layer, the fourth trench having an opening, sidewalls defining a width that is substantially equal to the width of the first trench, oxidizing the surface of the sidewalls of the fourth trench, and removing the second sacrificial layer, the third sacrificial layer, and material from the oxidized surface of the active layer over the fourth trench and exposing a sidewall of the fourth trench that defines a second trench width that is substantially equal to the first trench width. Alternatively, the method may further comprise forming a fifth trench adjacent the fourth trench, the fifth trench having an opening and sidewalls defining a width substantially equal to the first trench width, and removing a portion of the first sacrificial layer under the active layer between the fourth trench and the fifth trench to form a suspension element. In another embodiment, the step of etching the first trench and the second trench comprises etching the active layer using a deep reactive ion etch process. In still another embodiment, the step of removing material from the active layer between the first trench and the second trench comprises performing a gas phase etch on the active layer material between the first trench and the second trench. In still another embodiment, the step of removing material from the active layer between the first trench and the second trench comprises performing a wet etch on the active layer material between the first trench and the second trench.

In yet another embodiment, a method is provided for forming a wide trench and a narrow trench on a substrate including an active layer disposed over a first sacrificial layer, the active layer having a surface. The method comprises the steps of forming a first trench, a second trench, and a third trench in the active layer, each trench having an opening and sidewalls defining substantially equal first trench widths, oxidizing the surface of the active layer and the sidewalls of the first trench, the second trench, and the third trench to form a second sacrificial layer, depositing a sacrificial material over the second sacrificial layer to form a third sacrificial layer, sealing the openings of the trenches with at least a portion of the third sacrificial layer, etching a hole through a portion of the second and third sacrificial layers to expose a portion of the active layer, removing material from the active layer between the first trench and the second trench to form a cavity having sidewalls, depositing another sacrificial material over the third sacrificial layer and the sidewalls of the cavity to form a fourth sacrificial layer, sealing the cavity with at least a portion of the fourth sacrificial layer, and removing the second, third, and fourth sacrificial layers to expose the third trench and form a fourth trench in the active layer from the first and the second trenches, the fourth trench having sidewalls defining a second trench width that is greater than the first trench width.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method of forming a high-aspect ratio microelectromechanical (MEM) device on a substrate including a substrate layer, an active layer, and a first sacrificial layer disposed at least partially therebetween, the method comprising the steps of:

forming a first trench, a second trench, and a third trench in the active layer, each trench having an opening and sidewalls defining substantially equal first trench widths;

forming a second sacrificial layer over a surface of the active layer and the sidewalls of each of the trenches;

forming a third sacrificial layer over the second sacrificial layer and sealing the openings of each of the trenches with the third sacrificial layer;

forming an etch hole in the second sacrificial layer and the third sacrificial layer between the first trench and the second trench to expose a portion of the active layer;

removing material from the active layer between the first trench and the second trench to form a cavity having sidewalls and an opening;

forming a fourth sacrificial layer over the third sacrificial layer and the sidewalls of the cavity and sealing the cavity and its opening with the fourth sacrificial layer; and removing the second sacrificial layer, the third sacrificial layer, and the fourth sacrificial layer to expose the third trench and form a fourth trench in the active layer from the first and the second trench, the fourth trench having sidewalls defining a second trench width that is greater than the first trench width.

2. The method of claim 1, wherein the step of forming the first trench, the second trench, and the third trench comprises etching the active layer using a deep reactive ion etch process.

3. The method of claim 1, wherein the steps of forming the second sacrificial layer and forming the third sacrificial layer are combined and the second sacrificial layer and the third sacrificial layer are a single layer.

4. The method of claim 1, wherein the third and fourth trenches have substantially equal trench depths.

5. The method of claim 1, wherein the third sacrificial layer and fourth sacrificial layer comprise the same material.

6. The method of claim 1, wherein the step of forming the third sacrificial layer comprises:

depositing a sacrificial material over a portion of the second sacrificial layer overlying the surface of the active layer; and reflowing the sacrificial material to coat a portion of the second sacrificial layer overlying the sidewalls of the trenches and to seal the openings of the trenches.

7. The method of claim 1, wherein the step of forming the hole comprises:

depositing photoresist over the third sacrificial layer in a pattern, wherein the pattern includes a protected portion and an unprotected portion; and etching the second sacrificial layer and third sacrificial layer of the unprotected portion to form the hole exposing the active layer.

8. The method of claim 1, wherein the step of removing material from the active layer between the first trench and the second trench comprises:

performing a gas phase etch on the active layer material between the first trench and the second trench.

9. The method of claim 1, wherein the step of removing material from the active layer between the first trench and the second trench comprises:

performing a wet etch on the active layer material between the first trench and the second trench.

10. The method of claim 1, further comprising:

forming a first contact opening and a second contact opening through the second sacrificial layer, the third sacrificial layer, and the fourth sacrificial layer, after the step of forming the fourth sacrificial layer; and depositing an interconnect material over the third sacrificial layer and filling the first contact opening and second contact opening with the interconnect material to form an interconnect.

11. The method of claim 1, further comprising:
forming a fifth trench adjacent the third trench, the fifth trench having an opening and sidewalls defining a width substantially equal to the first trench width; and
removing a portion of the first sacrificial layer proximate the third trench and the fifth trench to form a suspension element from material of the active layer between the third trench and the fifth trench.

12. A method of forming a wide trench and a narrow trench on a substrate including an active layer disposed over a first sacrificial layer, the active layer having a surface, the method comprising the steps of:
etching a first trench and a second trench through the active layer to expose a surface of the first sacrificial layer, each trench having an opening, sidewalls defining a first trench width, and substantially equal and uniform first trench widths;
oxidizing the surface of the active layer and the sidewalls of the first trench and second trench;
depositing a sacrificial material over the oxidized surfaces to form a second sacrificial layer;
sealing the openings of the trenches with at least a portion of the second sacrificial layer;
etching a hole through a portion of the second sacrificial layer and the oxidized surface to expose a portion of the active layer;
removing material from the active layer between the first trench and the second trench to form a cavity having sidewalls;
depositing another sacrificial material over the second sacrificial layer and the sidewalls of the cavity to form a third sacrificial layer;
sealing the cavity with at least a portion of the third sacrificial layer; and
removing the second sacrificial layer, the third sacrificial layer, and material from the oxidized surface of the active layer to form a third trench in the active layer from the first and the second trenches, the third trench having sidewalls defining a second trench width that is greater than the first trench width.

13. The method of claim 12, further comprising:
forming a first contact opening and a second contact opening through the second sacrificial material, the third sacrificial material, and the oxidized surface, after the step of depositing another sacrificial material; and
depositing an interconnect material over the third sacrificial material and filling the first contact opening and second contact opening with the interconnect material to form an interconnect.

14. The method of claim 12, further comprising:
etching a fourth trench through the active layer, the fourth trench having an opening, sidewalls defining a width that is substantially equal to the width of the first trench;
oxidizing the surface of the sidewalls of the fourth trench; and
removing the second sacrificial layer, the third sacrificial layer, and material from the oxidized surface of the active layer over the fourth trench and exposing a sidewall of the fourth trench that defines a second trench width that is substantially equal to the first trench width.

15. The method of claim 12, further comprising:
forming a fifth trench adjacent the fourth trench, the fifth trench having an opening and sidewalls defining a width substantially equal to the first trench width; and
removing a portion of the first sacrificial layer under the active layer between the fourth trench and the fifth trench to form a suspension element.

16. The method of claim 12, wherein the step of etching the first trench and the second trench comprises etching the active layer using a deep reactive ion etch process.

17. The method of claim 12, wherein the step of removing material from the active layer between the first trench and the second trench comprises:
performing a gas phase etch on the active layer material between the first trench and the second trench.

18. The method of claim 12, wherein the step of removing material from the active layer between the first trench and the second trench comprises:
performing a wet etch on the active layer material between the first trench and the second trench.

19. A method of forming a wide trench and a narrow trench on a substrate including an active layer disposed over a first sacrificial layer, the active layer having a surface, the method comprising the steps of:
forming a first trench, a second trench, and a third trench in the active layer, each trench having an opening and sidewalls defining substantially equal first trench widths;
oxidizing the surface of the active layer and the sidewalls of the first trench, the second trench, and the third trench to form a second sacrificial layer;
depositing a sacrificial material over the second sacrificial layer to form a third sacrificial layer;
sealing the openings of the trenches with at least a portion of the third sacrificial layer;
etching a hole through a portion of the second sacrificial layer and the third sacrificial layer to expose a portion of the active layer;
removing material from the active layer between the first trench and the second trench to form a cavity having sidewalls;
depositing another sacrificial material over the third sacrificial layer and the sidewalls of the cavity to form a fourth sacrificial layer;
sealing the cavity with at least a portion of the fourth sacrificial layer; and
removing the second sacrificial layer, the third sacrificial layer, and fourth sacrificial layer to expose the third trench and form a fourth trench in the active layer from the first and the second trenches, the fourth trench having sidewalls defining a second trench width that is greater than the first trench width.

* * * * *